United States Patent
Wang et al.

(10) Patent No.: US 6,509,237 B2
(45) Date of Patent: Jan. 21, 2003

(54) FLASH MEMORY CELL FABRICATION SEQUENCE

(75) Inventors: Hsingya Arthur Wang, San Jose, CA (US); Peter Rabkin, Cupertino, CA (US); Frank Qian, Campbell, CA (US)

(73) Assignee: Hynix Semiconductor America, Inc., San Jose, CA (US)

( * ) Notice: Subject to any disclaimer, the term of this patent is extended or adjusted under 35 U.S.C. 154(b) by 0 days.

(21) Appl. No.: 09/854,086

(22) Filed: May 11, 2001

(65) Prior Publication Data

US 2002/0168824 A1 Nov. 14, 2002

(51) Int. Cl.⁷ ............................................. H01L 21/336
(52) U.S. Cl. ........................................................ 438/286
(58) Field of Search ......................................... 438/286

(56) References Cited

U.S. PATENT DOCUMENTS

| | | | | |
|---|---|---|---|---|
| 4,001,050 A | * | 1/1977 | Koo | 148/1.5 |
| 5,629,220 A | * | 5/1997 | Yang | 438/286 |
| 5,741,736 A | * | 4/1998 | Orlowski et al. | 438/286 |
| 5,763,308 A | * | 6/1998 | Choi | 438/286 |
| 5,920,776 A | * | 7/1999 | Fratin et al. | 438/286 |
| 6,232,183 B1 | * | 5/2001 | Chen et al. | 438/286 |

* cited by examiner

*Primary Examiner*—Olik Chaudhuri
*Assistant Examiner*—David S Blum
(74) *Attorney, Agent, or Firm*—Townsend and Townsend and Crew LLP

(57) ABSTRACT

An abrupt drain junction and a graded source junction are fabricated using a common diffusion step, wherein the common diffusion step is used to create both the drain junction and the source junction. The common diffusion step is accomplished while an oxide spacer is present over a gate stack, prior to the common diffusion step, resulting in faster source diffusion and a graded source junction, while the slower diffusion in the drain region results in an abrupt drain junction. The oxide spacer moves the drain junction further away from the gate stack to allow for greater cell densities.

11 Claims, 2 Drawing Sheets

FLASH MEMORY CELL FABRICATION SEQUENCE

BACKGROUND OF THE INVENTION

The present invention relates to the field of semiconductor processing. More specifically, the present invention relates to efficient methods of forming and controlling the configuration of source and drain junctions in transistor devices.

An example of a process of fabricating a transistor with a graded source junction, for increasing the source junction breakdown voltage and allowing higher voltages to be applied to the source of the transistor, is described in co-pending and commonly assigned U.S. patent application Ser. No. 09/777,007. In this fabrication process, the source junction is formed in a semiconductor substrate by masking the substrate for a source implant, implanting the source region with a dopant (or several dopants), removing the source mask, and activating and driving in the source dopant (i.e. diffusing the dopant) in the course of a thermo-cycle (i.e. diffusion cycle). Following these steps, a drain junction is then formed by masking the transistor for a drain implant, implanting the drain region with a dopant, removing the drain mask and, finally, activating and driving in the drain dopant.

During the diffusion cycles, the source and drain junctions spread laterally (and vertically) underneath the gate region of the transistor. While some degree of lateral diffusion is required to ensure that proper channel formation will result, excessive lateral diffusion presents limits as to how short the gate feature or gate length can be made. A limit is encountered due to the necessity of avoiding high leakage and punch-through, i.e., the merging of the source and drain depletion regions during operation. The inability to reduce the gate length is undesirable, since it prevents manufacturing smaller cell sizes and greater cell densities.

SUMMARY OF THE INVENTION

In a first aspect of the invention an abrupt drain junction and a graded source junction are fabricated using a common diffusion step. The common diffusion step is used to form both the drain and source junctions. This common diffusion process may be used in a NOR cell of a flash memory, but can also be used in other types of semiconductor transistors.

In a second aspect of the invention, a common diffusion step is performed after a dielectric spacer is formed over the transistor's gate stack.

In a third aspect of the invention, a transistor fabrication process starts with forming a gate structure on a substrate, according to conventional methods. After the gate structure has been formed, a drain region is covered by a source mask and a first source dopant is implanted in a source region of the substrate. An optional and additional dopant having a lower diffusivity, for example arsenic, may also be implanted during this step. In the next step the gate structure is covered with a dielectric material, such as, for example $SiO_2$, to form a dielectric spacer. After the dielectric spacer is formed, a drain dopant, having a diffusivity that is lower than the diffusivity of the first source dopant (e.g. arsenic), is implanted in a drain region of the substrate. Finally, in the last step, the source and drain dopants are driven in by diffusion, to form source and drain junctions within the substrate.

In a fourth aspect of the invention, a transistor fabrication process starts with forming a gate stack on a semiconductor substrate, according to conventional methods. After the gate stack has been formed, a drain region of the transistor is covered by a source mask and a first dopant of, for example phosphorous, is implanted through the source mask, to form a source implant layer. An optional and additional dopant having a lower diffusivity, for example arsenic, may also be implanted during this step. In the next step, a dielectric layer is deposited and etched back to form a dielectric spacer over the gate stack. After the dielectric spacer is formed, another dopant having a lower diffusivity than the first dopant, for example arsenic, is implanted through a drain mask to form a drain implant layer. The source implant layer may be covered or uncovered during this step. Finally, both the source and drain regions are driven by diffusion to finalize formation of the source and drain junctions.

One advantage of the process is that, because of the presence of a source implant layer with higher diffusivity, e.g. phosphorus, diffusion is faster in the source region and results in a graded source junction, while the slower diffusion in the drain region results in a relatively more abrupt drain junction. Another advantage is that both the source and drain diffusions are performed at the same time, thereby simplifying and eliminating a step in the fabrication process.

An additional benefit is that the dielectric spacer moves the drain junction further away from the gates. This benefit occurs whether or not the cell is fabricated with the graded source/abrupt drain. With less of a drain-gate overlap, cells with the same effective channel length can be made with smaller gate feature sizes (or drawn channel lengths), thus allowing for greater cell density.

A further understanding of the nature and advantages of the inventions herein may be realized by reference to the remaining portions of the specification and the attached drawings.

DESCRIPTION OF THE PREFERRED EMBODIMENTS

Figure 1A:
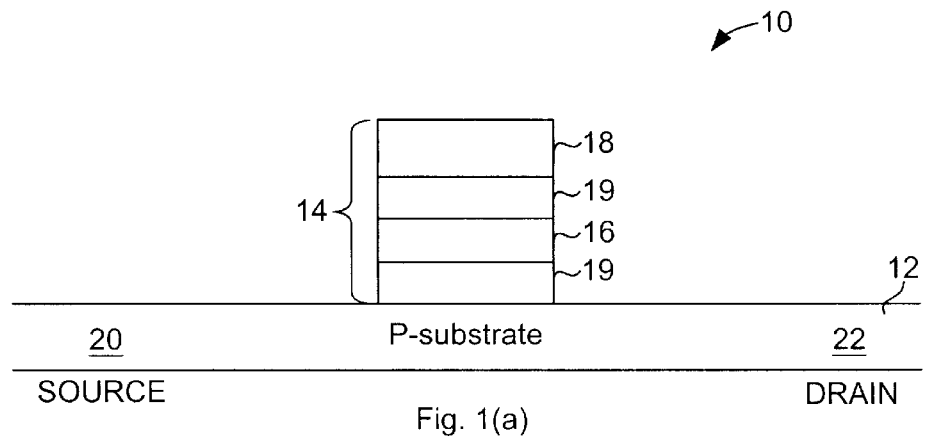
FIGS. 1(a)–(f) illustrate a transistor fabrication sequence according to one embodiment of the present invention.

FIGS. 1(a)–(f) form a sequence of cross-sectional views of a transistor 10 being fabricated on a semiconductor substrate 12, according to an embodiment of the present invention. FIG. 1(a) shows transistor 10 with a gate stack 14 fabricated thereon. Gate stack 14 is a flash memory gate stack fabricated according to conventional techniques, however it should be understood that other gate stacks, or a single gate, might also be used. Gate stack 14 is shown comprising a control gate 16 and a floating gate 18, with insulating layers 19 separating control gate 16 from floating gate 18 and floating gate 18 from substrate 12. FIG. 1(a) also shows a source region 20 at which a source junction will later be formed and a drain region 22 at which a drain junction will later be formed.

Figure 1B:
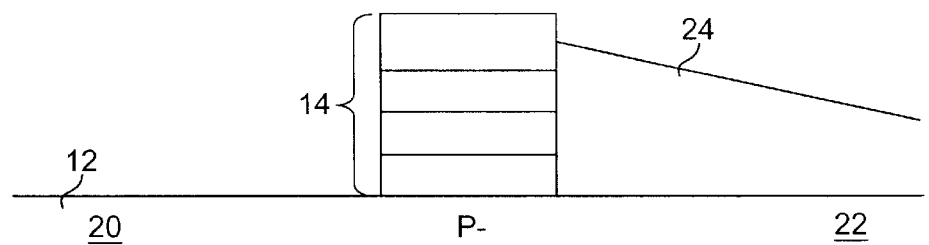
Figure 1C:
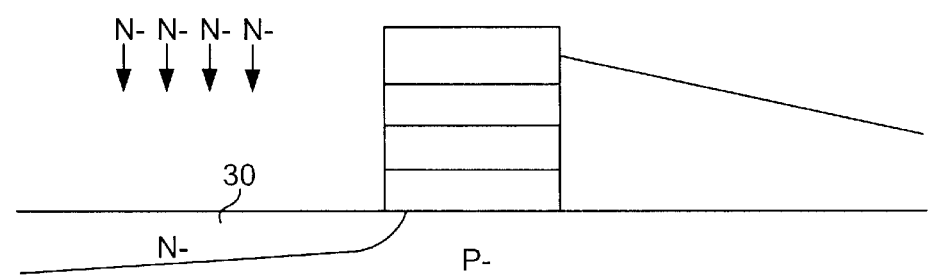

As shown in FIG. 1(b), drain region 22 is masked with a mask 24 and then, as shown in FIG. 1(c), source region 20 is implanted with an n-type dopant, such as for example, phosphorous, to form an N− implant layer 30. If phosphorous is used, the implant dose may be, for example, between about $(1-5) \times 10^{14}$ $cm^{-2}$ and the implant energy may be between about 30–60 KeV. An optional and additional n-type dopant having a lower diffusivity than the first n-type dopant, for example arsenic, may be also implanted during this step to form a more heavily doped N+ region. In this optional step, the implant dose may be, for example, between about $(2-4) \times 10^{15}$ cm$^{-2}$ and the implant energy may be between about 30–60KeV.

Figure 1D:
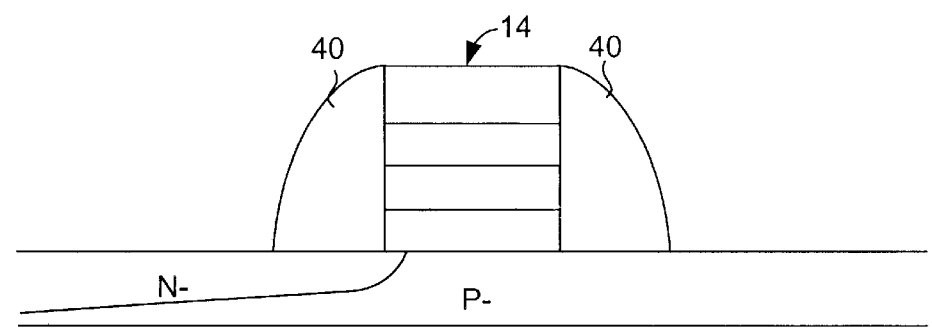

As shown in FIG. 1(d), mask 24 is removed and a dielectric spacer 40 is formed on the walls of gate stack 14. The dielectric spacer may be formed using a conventional technique, for example a deposition process such as chemical vapor deposition, followed by an etching process (e.g. reactive ion etching). In one embodiment, the dielectric spacer is an oxide spacer having a width 45 within the range of about 200–800 Å; however, the width may be outside this range, depending on junction optimization and other device requirements.

Figure 1E:
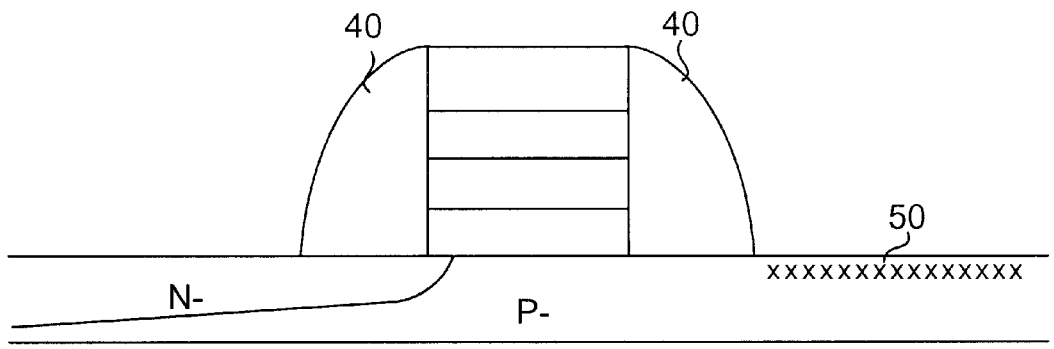
Figure 1:
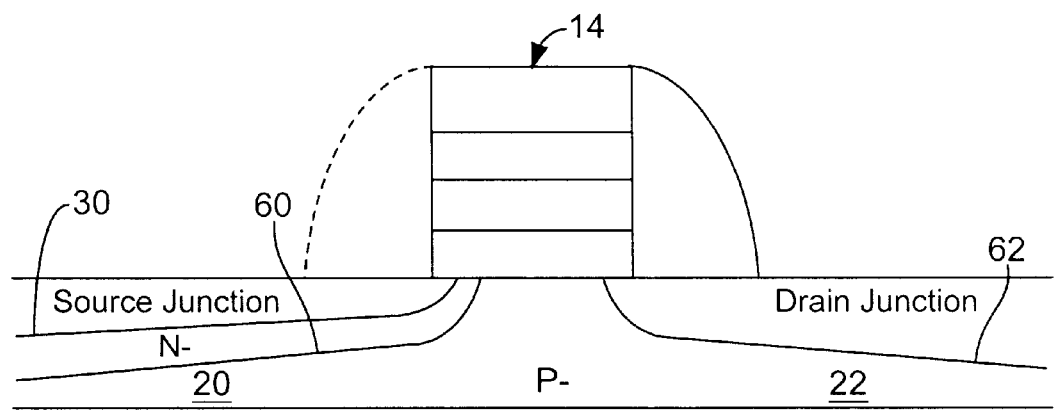

With dielectric spacer 40 in position, drain region 22 is implanted with implant 50, for example arsenic, as shown in FIG. 1(e), to form highly doped N+ drain region. The implant dose may be, for example, between about $(4-6) \times 10^{15}$ cm$^{-2}$ and the implant energy may be between about 30–60 KeV. The source region 20 can be covered for the implant step, or can be left unmasked. FIG. 1(e) shows the option of where source region 20 is masked by the drain mask 55. The other option is not shown in the figures.

Once implant 50 and dielectric spacer 40 are in place, a source junction 60 and a drain junction 62 are driven into source region 20 and drain region 22, respectively, by a common diffusion step as shown in FIG. 1(f). This diffusion step may be accomplished during BPSG (borophosphosilicate glass) flow after BPSG deposition, at a temperature and duration of, for example, between about 850–900° C. and 20–30 minutes. Because the dopant for the source has a dopant component (e.g. phosphorous) with a higher diffusivity than that of the drain, diffusion is more extensive for source junction 60 than it is for drain junction 62. The difference in diffusivities results in the source junction being graded and the drain junction being relatively abrupt.

Following the common diffusion step, standard backend processing, e.g. contact formation, metallization and passivation can be performed to complete the fabrication process.

According to the process of the present invention, spacer 40 is formed prior to the drain implant. The presence of spacer 40 results in a reduced gate stack 14 overlap with drain junction 62. While some overlap is necessary to provide complete coverage of the channel by gate stack 14, with less overlap, the drawn dimension of the gate can be smaller for the same effective channel length. As a result, transistors can be spaced closer together without reducing their effective channel length and without the risk of punchthrough. Hence, according to the process of the present invention, the gate feature size and overall cell size can be made smaller. In simulations of flash memory cells having smaller gate features, fabricated according to the process of the present invention, the cells were found to have desirable properties during programming and erasing, as well as maintaining these properties over many program/erase cycles.

In a preferred embodiment, the drain implant step and the source/drain diffusion step are incorporated into steps performed while fabricating non-cell transistors, such as power (i.e. high-voltage) transistors, control transistors and sense amplifier transistors. In other words, the drain mask is preferably part of a larger mask used to perform N+ implants for all n-channel transistor junctions. By combining these steps, the overall chip fabrication process is simplified.

The above description is illustrative and not restrictive. Many variations of the invention will become apparent to those of skill in the art upon review of this disclosure.

Merely by way of example, the above-described fabrication techniques could be used with other flash memory cells, such as NAND cells, or could be used with transistors unrelated to flash memory cells or any other type or memory cell. And, while the device structure and process were described in the context of n-channel transistors, the process could be easily modified so that p-channel devices might also be fabricated. Further, whereas exemplary doping concentrations and dielectric spacer dimensions have been provided, it should be recognized that these parameters may be varied depending on the design needs and applications at hand. Accordingly, the scope of the invention should, therefore, be determined not with reference to the above description, but instead should be determined with reference to the appended claims along with their full scope of equivalents.

What is claimed is:

1. A method of fabricating a transistor, comprising the steps of:

forming a gate structure on a substrate;

implanting a first source dopant in a source region of the substrate;

covering the gate structure with a dielectric material to form a dielectric spacer;

implanting a drain dopant in a drain region of the substrate, said drain dopant having a lower diffusivity than a diffusivity of the first source dopant;

implanting a second source dopant during the step of implanting the drain dopant; and driving in the source and drain dopants by diffusion, during a single diffusion cycle, to form source and drain junctions within the substrate.

2. The method of claim 1, wherein the gate structure comprises a gate stack having a control gate and a floating gate.

3. The method of claim 1 wherein the source junction has a doping profile that is linearly graded relative to the drain junction, which has a relatively more abrupt doping profile.

4. The method of claim 1 wherein the dielectric material is an oxide.

5. A method of fabricating a flash memory cell, comprising the steps of:

forming a gate stack on a substrate, the gate stack comprising a control gate and floating gate;

masking a drain region;

implanting a source dopant in a source region to form a source implant layer;

forming a dielectric spacer over the gate stack;

uncovering at least the drain region;

implanting a drain dopant into the drain region to form a drain implant layer, wherein implanting the drain dopant also comprises implanting source and drain regions for all other non-cell transistors formed in the substrate; and driving in the source and drain implant layers into the substrate by diffusion, during a single diffusion cycle, to form source and drain junctions.

6. The method of claim 5, further comprising the step of uncovering the source region, prior to the step of implanting the drain dopant.

7. The method of claim 5 wherein the step of implanting the source dopant comprises the steps of:
   implanting a first source dopant in the source region; and
   implanting a second source dopant in the source region, the first source dopant having a higher diffusivity than a diffusivity of the second source dopant.

8. The method of claim 7, further comprising the step of covering the source region, prior to the step of implanting the second dopant.

9. The method of claim 5 wherein the source dopant has a higher diffusivity than a diffusivity of the drain dopant.

10. The method of claim 5 wherein the source junction has a doping profile that is linearly graded relative to the drain junction, which has a relatively more abrupt doping profile.

11. The method of claim 5 wherein the dielectric material is an oxide.

* * * * *